(12) United States Patent
Song et al.

(10) Patent No.: US 9,252,163 B1
(45) Date of Patent: Feb. 2, 2016

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xingxing Song, Beijing (CN); Chaohuan Hsu, Beijing (CN); Zhengwei Chen, Beijing (CN); Zhenfei Cai, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 14/739,056

(22) Filed: Jun. 15, 2015

(30) Foreign Application Priority Data

Sep. 2, 2014 (CN) .......................... 2014 1 0443924

(51) Int. Cl.
*H01L 23/52* (2006.01)
*H01L 23/48* (2006.01)
*H01L 27/12* (2006.01)

(52) U.S. Cl.
CPC .......... *H01L 27/124* (2013.01); *H01L 27/1259* (2013.01)

(58) Field of Classification Search
CPC .......................... H01L 27/124; H01L 27/1259
USPC ........................................................... 257/774
See application file for complete search history.

(56) References Cited

U.S. PATENT DOCUMENTS

| | | | | |
|---|---|---|---|---|
| 8,111,367 | B2 * | 2/2012 | Ueda ................... | G02F 1/13452 349/138 |
| 2003/0164919 | A1 * | 9/2003 | Oh ...................... | G02F 1/13452 349/149 |
| 2008/0079889 | A1 * | 4/2008 | Lee ..................... | G02F 1/13452 349/151 |
| 2008/0180627 | A1 * | 7/2008 | Yasuda .............. | G02F 1/13452 349/152 |

\* cited by examiner

*Primary Examiner* — Luan C Thai
(74) *Attorney, Agent, or Firm* — Baker Hostetler LLP (57) ABSTRACT

In the present disclosure, it is provided an array substrate including a pad area, signal lines arranged on the substrate, conductive connection lines arranged at least on the pad area and directly connected to a flexible circuit, and conductive connection lines arranged at least on the pad area and directly connected to a flexible circuit. The conductive connection lines may be connected to the signal lines through a via hole, and may include a first wire and a second wire electrically connected to each other. The second wire may be arranged in such a manner that a contact area between the conductive connection lines and the flexible circuit is not less than a predetermined threshold when the flexible circuit is displaced in a first direction relative to the first wire. The first direction may be substantially perpendicular to an extending direction of the first wire.

20 Claims, 6 Drawing Sheets

ARRAY SUBSTRATE, METHOD FOR MANUFACTURING THE SAME, AND DISPLAY DEVICE

CROSS REFERENCE OF RELATED APPLICATION

The present disclosure claims the priority of Chinese patent application No. 201410443924.9 filed on Sep. 2, 2014, the disclosure of which is incorporated herein by reference.

TECHNICAL FIELD

The present disclosure relates to a technical field of displaying, and more particular to an array substrate, a method for manufacturing the array substrate and a display device.

BACKGROUND

A Thin Film Transistor Liquid Crystal Display (TFT-LCD) is one of main flat panel display devices. Based on a direction of an electric field for driving liquid crystal molecules, TFT-LCDs are divided into two types: i.e. a vertical electric field type of TFT-LCD and a horizontal electric field type of TFT-LCD. In the vertical electric field type of TFT-LCD, pixel electrodes are required to be formed on an array substrate, and common electrodes are required to be formed on a color filter substrate. In contrast, in the horizontal electric field type of TFT-LCD, both the pixel electrodes and the common electrodes are required to be formed on the array substrate simultaneously. Thus, in a process of manufacturing the horizontal electric field type of TFT-LCD, a further patterning process is required to be incorporated to form the common electrodes. The vertical electric field type of TFT-LCD includes a Twist Nematic (TN) type of TFT-LCD; and the horizontal electric field type of TFT-LCD includes a Fringe Field Switching (FFS) type of TFT-LCD and an In-Plane Switching (IPS) type of TFT-LCD. The horizontal electric field type of TFT-LCD, especially the FFS type of TFT-LCD has such advantages as wide viewing angle and high aperture ratio, and has been extensively used in the liquid crystal displays.

Based on functions, an area of the array substrates may be divided into an array area and a pad area. In particular, the array area is an operating area of the array substrate, and includes components such as signal lines (for example, gate lines, data lines and common electrode lines), pixel electrodes, common electrodes and Thin Film Transistors (TFTs). The electric field for driving the liquid crystal molecules is formed by such components. The pad area is also a crimping area on which the signal lines of the array substrate are connected to an external driving circuit (for example, a flexible circuit (Chip On Flex, COF)) after processes of cutting and grinding. Typically, merely the signal lines are provided in the pad area without components such as pixel electrodes and the TFTs. The pad area is provided on one edge or two intersecting ones of four edges of the array substrate. In the pad area, the driving circuit is connected to the signal lines of the array substrate by conductive connection lines. The conductive connection lines are generally made of Indium Tin Oxide (ITO) or Indium Zinc Oxide (IZO), because the pattern of the conductive connection lines may be formed simultaneously upon forming the pixel electrodes or the common electrodes with the material such as ITO or IZO by a patterning process, which simplifies the manufacturing process.

Figure 1:
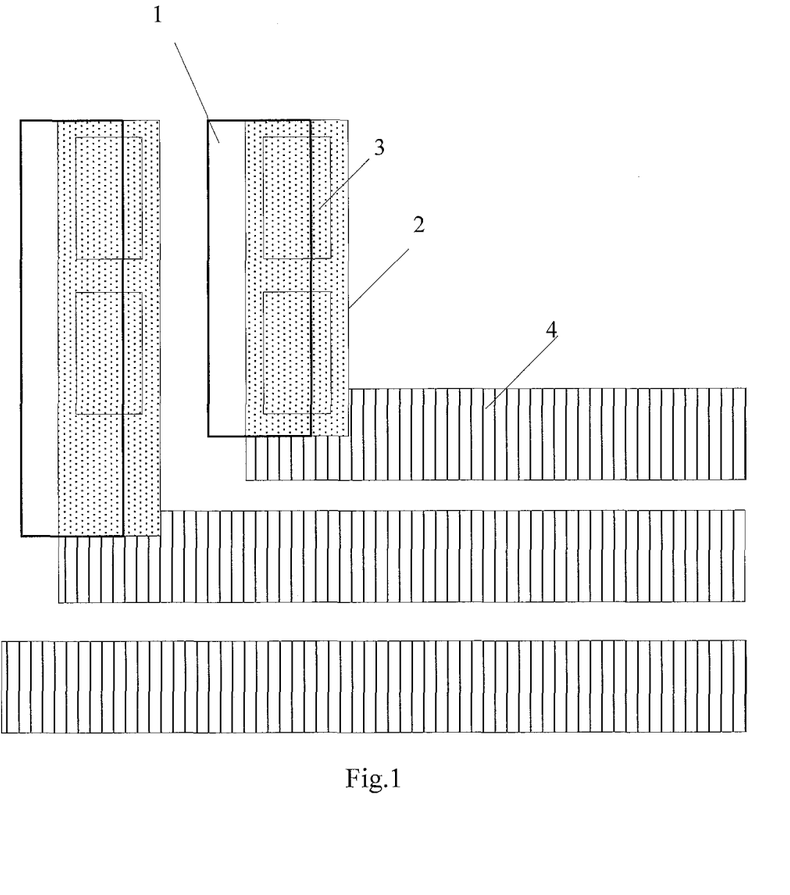
FIG. 1 illustrates a structure of wires in a conventional pad area.

As illustrated in FIG. 1, in the pad area, a flexible circuit 1 is directly connected to the conductive connection lines 2, and the conductive connection lines 2 are connected to the signal lines 4 through via holes 3, so that the display signal is transmitted from the flexible circuit 1 to source-drain electrodes of the array substrate through the conductive connection lines 2.

As illustrated in FIG. 1, upon being bound with the array substrate, the flexible circuit is prone to being displaced horizontally or longitudinally. Furthermore, the conductive connection lines are conventionally arranged in a pattern of longitudinal and parallel lines (being substantially vertical to the signal lines) in the pad area, which may only compensate for the affection of longitudinally displacement of the flexible circuit. However, when the flexible circuit is displaced horizontally, a size of a contact area between the flexible circuit and the conductive connection lines is reduced dramatically, which affects the transmission of the display signal and results in the defect of non-uniformly displaying such as black blocks in huge size. In extreme cases, the display may not properly operate and severely deteriorate the quality of displaying, and such defects particularly happen in a metal oxide TFT array substrate.

SUMMARY

An object of the present disclosure lies in providing an array substrate, a method for manufacturing the array substrate and a display device, which may effectively ensure an area between a flexible circuit and conductive connection lines to be large enough, and adverse effect caused by displacement of the flexible circuit is reduced, so that occurrence of the defect of non-uniformly displaying is effectively reduced.

In the present disclosure, it is provided the following technical solutions for solving the above technical problem.

In one aspect, it is provided an array substrate including a pad area. The array substrate may include:

signal lines arranged on the substrate; and conductive connection lines, arranged at least on the pad area and directly connected to a flexible circuit. The conductive connection lines may be connected to the signal lines through a via hole, and include a first wire and a second wire electrically connected to each other. The second wire may be arranged in such a manner that a contact area between the conductive connection lines and the flexible circuit is not less than a predetermined threshold when the flexible circuit is displaced in a first direction relative to the first wire. And the first direction may be substantially perpendicular to an extending direction of the first wire.

Furthermore, in the pad area, a pattern of the signal lines in a direction perpendicular to the array substrate may coincide with a pattern of the conductive connection lines.

Furthermore, the extending direction of the first wire may be substantially parallel to the flexible circuit.

Furthermore, an extending direction of the second wire may be substantially perpendicular to the extending direction of the first wire.

Furthermore, the conductive connection lines may be made of Indium Tin Oxide (ITO) or Indium Zinc Oxide (IZO).

Furthermore, the signal lines may be gate lines, data lines or common electrode lines.

Furthermore, the array substrate may further include:

an insulation layer, arranged to enable the gate lines, the data lines or the common electrode lines to be insulated from each other.

Furthermore, the insulation layer may include a gate insulation layer and a passivation layer.

Furthermore, the conductive connection lines may be in a shape of "+", "⊤" or "⊥".

In the embodiments of the present disclosure, it is further provided a display device including the above array substrate and a flexible circuit directly connected to the conductive connection lines.

In the embodiments of the present disclosure, it is further provided a method for manufacturing the above array substrate including a pad area. And the method may include:

depositing a metal film, and forming a pattern of signal lines by a patterning process; and depositing a conductive film, and forming a pattern of conductive connection lines at least on the pad area by another patterning process, so that the conductive connection lines are connected to the signal lines through a via hole, and include a first wire and a second wire electrically connected to each other. The second wire may be arranged in such a manner that a contact area between the conductive connection lines and the flexible circuit is not less than a predetermined threshold when the flexible circuit is displaced in a first direction relative to the first wire. And the first direction may be substantially perpendicular to an extending direction of the first wire.

In the embodiments of the present disclosure, the following advantageous effects may be achieved.

In the above solutions, in addition to the first wire, the conductive connection lines further include the second wire connected to the first wire. The second wire is arranged so that the contract area between the conductive connection lines and the flexible circuit is not less than a predetermined threshold when the flexible circuit is displaced in the first direction relative to the first wire. The technical solutions of the present disclosure may ensure the area between the flexible circuit and the conductive connection lines to be large enough, and the adverse effect caused by the displacement of the flexible circuit is reduced, so that the occurrence of the defect of non-uniformly displaying is effectively reduced.

DETAILED DESCRIPTION

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the embodiment of the present disclosure, it is provided an array substrate, a method for manufacturing the array substrate and a display device, which may effectively ensure the area between the flexible circuit and the conductive connection lines to be large enough, and the adverse effect caused by the displacement of the flexible circuit is reduced, so that the occurrence of the defect of non-uniformly displaying is effectively reduced.

In the embodiments of the present disclosure, it is provided an array substrate including a pad area, the array substrate includes:

signal lines arranged on the substrate;

conductive connection lines, arranged at least on the pad area and directly connected to a flexible circuit, wherein the conductive connection lines are connected to the signal lines through a via hole, and include a first wire and a second wire electrically connected to each other; wherein the second wire is arranged in such a manner that a contact area between the conductive connection lines and the flexible circuit is not less than a predetermined threshold when the flexible circuit is displaced in a first direction relative to the first wire; and wherein the first direction is substantially perpendicular to an extending direction of the first wire.

In the array substrate according to the present disclosure, in addition to the first wire, the conductive connection lines further include the second wire connected to the first wire. The second wire is arranged so that the contract area between the conductive connection lines and the flexible circuit is not less than a predetermined threshold when the flexible circuit is displaced in the first direction relative to the first wire. The technical solutions of the present disclosure may ensure the area between the flexible circuit and the conductive connection lines to be large enough, and the adverse effect caused by the displacement of the flexible circuit is reduced, so that the occurrence of the defect of non-uniformly displaying is effectively reduced.

Furthermore, in the pad area, the pattern of the signal lines in the direction perpendicular to the array substrate coincides with the pattern of the conductive connection lines, and the conductive connection lines may be connected to the signal lines through a plurality of via holes, so that the signal may be transmitted from the flexible circuit to the signal lines through the conductive connection lines.

Furthermore, the extending direction of the first wire is substantially parallel to the flexible circuit. Thus, the first wire is arranged so that when the flexible circuit is displaced in the extending direction of the first wire relative to the first wire, the adverse effect caused by the displacing of the flexible circuit in this direction is minimized.

Furthermore, an extending direction of the second wire is substantially perpendicular to the extending direction of the first wire. In general, upon being bound with the array substrate, the flexible circuit may be displaced longitudinally or horizontally. Thus when the first wire is arranged to be longitudinal, the first wire is arranged to compensate for the adverse effect of the flexible circuit being displaced longitudinally, and the second wire is arranged to compensate for the adverse effect of the flexible circuit being displaced horizontally.

Furthermore, the conductive connection lines may be made of ITO or IZO. Thus, the pattern of the conductive connection lines may be formed simultaneously upon forming pixel electrodes or common electrodes with the material such as the ITO or the IZO by a patterning process, which simplifies the process of manufacturing.

Furthermore, the signal lines may be gate lines, data lines or common electrode lines.

Furthermore, the array substrate further includes:

an insulation layer, configured to enable the gate lines, the data lines or the common electrode lines to be insulated from each other.

Furthermore, the insulation layer includes a gate insulation layer and a passivation layer.

In the embodiments of the present disclosure, it is further provided a display device including the above array substrate and a flexible circuit directly connected to the conductive connection lines. The display device may be an LCD panel, an LCD TV, an LCD monitor, a digital photo frame, a mobile phone, a tablet computer, or any other products or parts with displaying function.

Figure 8:
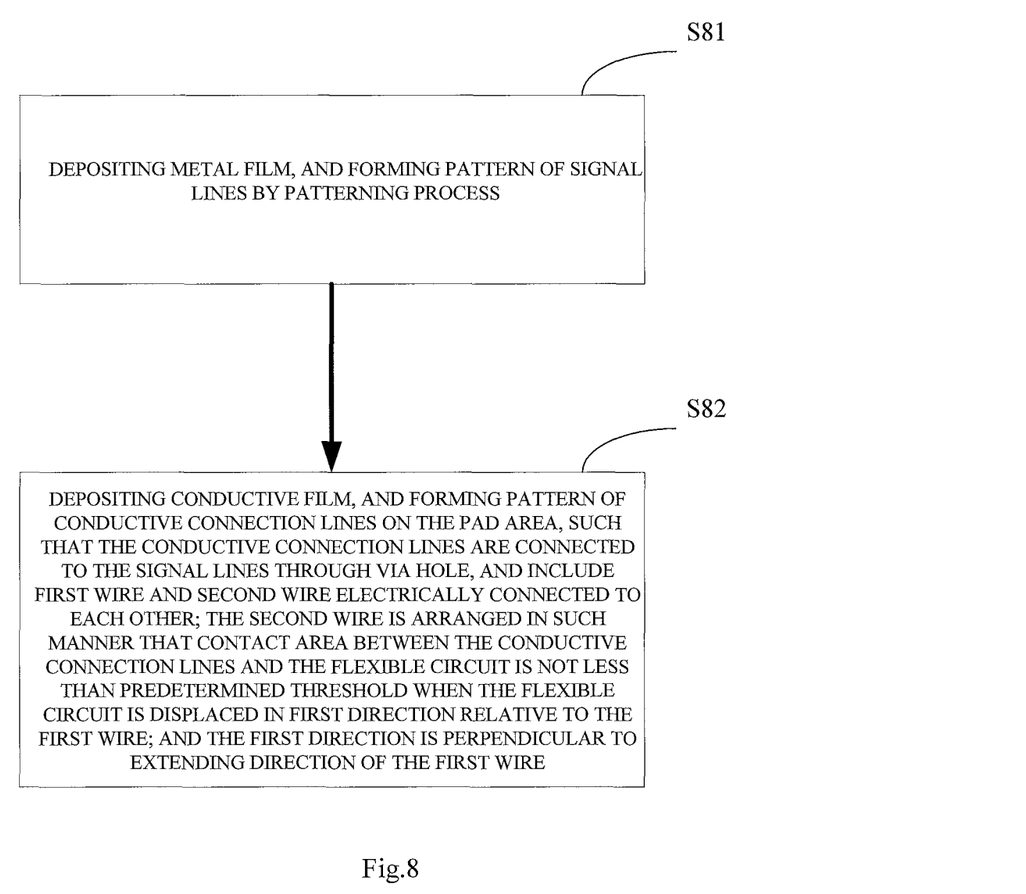
FIG. 8 is a flowchart of a method for manufacturing the array substrate according to an embodiment of the present disclosure.

In the embodiments of the present disclosure, it is further provided a method for manufacturing the above array substrate including a pad area. And as illustrated in FIG. 8, the method includes:

step S81, depositing a metal film, and forming a pattern of signal lines by a patterning process; and step S82, depositing a conductive film, and forming a pattern of conductive connection lines at least on the pad area by another patterning process, so that the conductive connection lines are connected to the signal lines through a via hole, and include a first wire and a second wire electrically connected to each other; wherein the second wire is arranged in such a manner that a contact area between the conductive connection lines and the flexible circuit is not less than a predetermined threshold when the flexible circuit is displaced in a first direction relative to the first wire; and wherein the first direction is substantially perpendicular to an extending direction of the first wire.

In the array substrate according to the present disclosure, in addition to the first wire, the conductive connection lines further include the second wire connected to the first wire. The second wire is arranged so that the contract area between the conductive connection lines and the flexible circuit is not less than a predetermined threshold when the flexible circuit is displaced in the first direction relative to the first wire. The technical solutions of the present disclosure may ensure the area between the flexible circuit and the conductive connection lines to be large enough, and the adverse effect caused by the displacement of the flexible circuit is reduced, so that the occurrence of the defect of non-uniformly displaying is effectively reduced.

In the following, the array substrate and the method for manufacturing the array substrate according to the embodiments of the present disclosure will be explained in details by referring to the figures.

Conventionally, upon being bound with the array substrate, the flexible circuit may be displaced horizontally or longitudinally, so that a contact area between the flexible circuit and the conductive connection lines are reduced dramatically, which severely deteriorates displaying quality. For the displaying quality improvement, a higher alignment precision is required, which makes the manufacturing more challenging.

Figure 2:
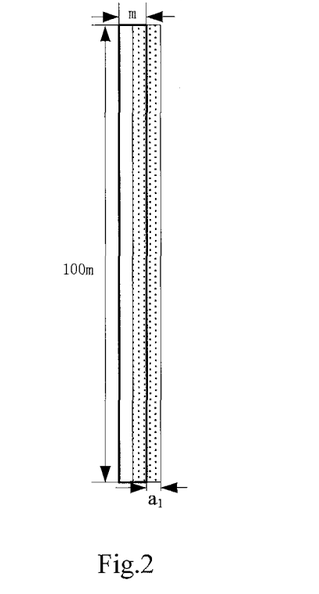
FIG. 2 illustrates a longitudinal projection of the flexible circuit in the case of a horizontal displacement.
Figure 3:
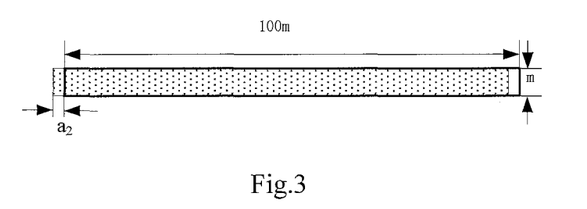
FIG. 3 illustrates a horizontal projection of the flexible circuit in the case of a horizontal displacement.

As illustrated in FIG. 2, it is assumed that the conductive connection lines are in a pattern of a longitudinal rectangle with an aspect ratio of 100:1, the flexible circuit is also in a pattern of a longitudinal rectangle with an aspect ratio of 100:1, and the contact area between the conductive connection lines and the flexible circuit is $S_1$ if a horizontal displacement value of the flexible circuit relative to the conductive connection lines is $a_1$. As illustrated in FIG. 3, it is assumed that the conductive connection lines are in a pattern of a horizontal rectangle with an aspect ratio of 100:1, the flexible circuit is also in a pattern of a horizontal rectangle with an aspect ratio of 100:1, and the contact area between the conductive connection lines and the flexible circuit is $S_2$ if a horizontal displacement value of the flexible circuit relative to the conductive connection lines is $a_2$. Accordingly we can obtain:

if $a_1=a_2=0.1$, then $S_1=90$; $S_2=99.9$
if $a_1=a_2=0.2$, then $S_1=80$; $S_2=99.8$
if $a_1=a_2=0.3$, then $S_i=70$; $S_2=99.7$
. . . .

It can be seem from above that $S_2$ is far greater than $S_1$, and the larger the horizontal displacement vale is, the larger the difference between $S_1$ and $S_2$ is. Thus, a horizontal portion is incorporated into the conductive connection lines, which can effectively ensure the contact area between the flexible circuit and the conductive connection lines to be large enough upon the flexible circuit horizontally being displaced relative to the conductive connection lines, and thus minimize the adverse effect caused by the horizontal displacement.

Figure 4:
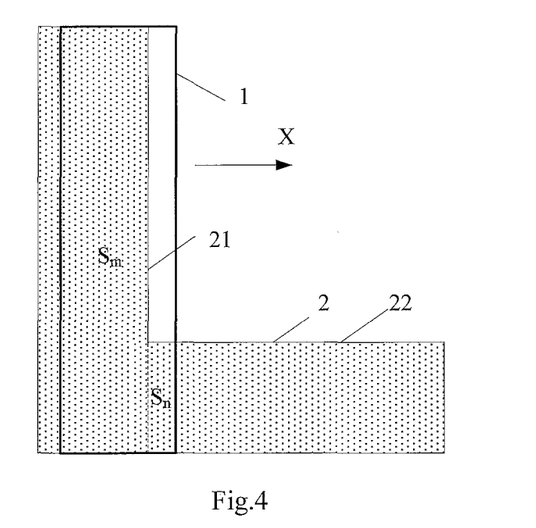
FIG. 4 and FIG. 5 illustrate the flexible circuit being displaced in an X direction relative to the conductive connection lines.
Figure 5:
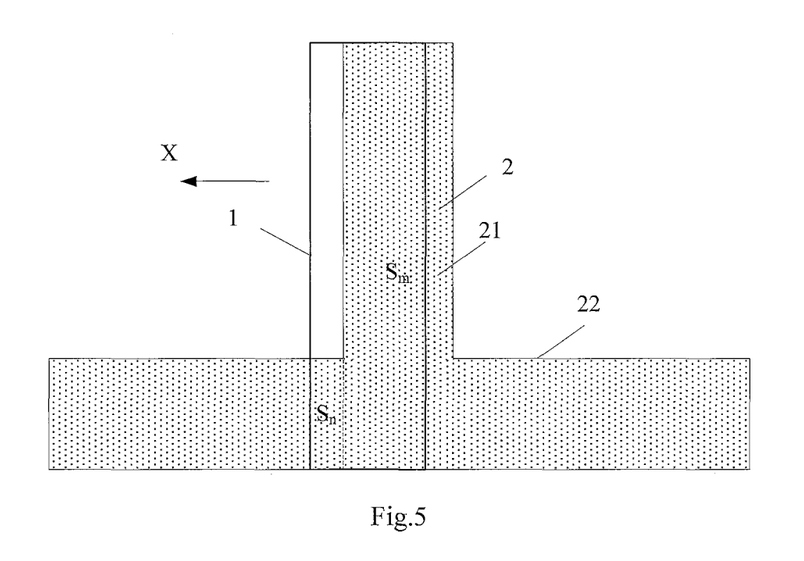

In the solution for designing the conductive connection lines according to the present disclosure, in addition to the first wire that is in a direction being parallel to the flexible circuit, the conductive connection lines further include the second wire connected to the first wire. An angel a between the second wire and the first wire is greater than 0 degree and less than 180 degree. Preferably, α is 90 degree. In other words, the first wire is substantially perpendicular to the second wire, and the conductive connection lines are in a pattern of "+", "┬", "⊥", or etc. As illustrated in FIG. 4 and FIG. 5, the conductive connection lines 2 include a first wire 21 and a second wire 22 being perpendicular to the first wire 21. If the flexible circuit 1 is displaced in the X direction relative to the conductive connection lines 2, a contact area between the flexible circuit 1 and the first wire 21 is $S_m$, and the contact area between the flexible circuit 1 and the conductive connection lines 2 is $S_m+S_n$. Thus, the second wire 22 is arranged so that the contact area between the flexible circuit 1 and the conductive connection lines 2 can be increased.

If both the direction of the flexible circuit and the direction of the first wire are arranged to be longitudinal, the first wire is arranged to compensate for the adverse effect of the flexible circuit being displaced longitudinally, and the second wire is arranged to compensate for the adverse effect of the flexible circuit being displaced horizontally. As a result, no matter whether the flexible circuit is displaced horizontally or longitudinally, the contact area between the flexible circuit and the conductive connection lines are kept to be large enough, and the adverse effect caused by the displacement of the flexible circuit is reduced, so that the occurrence of the defect of non-uniformly displaying is effectively reduced and the complexity of manufacturing is reduced.

First Embodiment

In this embodiment, the method for manufacturing the array substrate specifically includes the following steps:

Step 1, providing a base substrate on which a pattern of common electrodes is formed.

Specifically the base substrate may be a glass substrate or a quartz substrate. In particular, a transparent conductive layer with a thickness of about 300-1500 Å is deposited on the base substrate by a process of sputtering or thermal evaporation. The transparent conductive layer may be made of ITO, IZO or other kinds of transparent metal oxide. The transparent conductive layer is coated with a layer of the photoresist, the photoresist is exposed by the mask plate to respectively form a photoresist-removed area and a photoresist-remained area. Here, the photoresist-remained area corresponds to an area where the pattern of the common electrodes resides on, and the photoresist-removed area corresponds to an area other than the pattern of the common electrodes. Then it is subjected to a developing process. The photoresist in the photoresist-removed area is totally removed, and the thickness of the photoresist in the photoresist-remained area remains unchanged. The film of the transparent and conductive layer in the photoresist-removed area is totally removed by the etching process, and the remaining photoresist is removed, so that the pattern of the common electrodes is formed.

Step 2, forming a pattern of gate electrodes and gate lines on the substrate after the completion of step 1.

In particular, a gate metal layer with a thickness of about 500-4000 Å is deposited on the base substrate by the process of sputtering or thermal evaporation after the completion of step 1, the gate metal layer may be made of the metal such as Cu, Al, Ag, Mo, Cr, Nd, Ni, Mn, Ti, Ta, W or a composition of those metals, the gate metal layer may be in a single layer structure or a multi-layer structure, and the multi-layer structure may be of, for example Cu\Mo, Ti\Cu\Ti, Mo\Al\Mo or etc. A layer of photoresist is coated on the gate metal layer. The photoresist is exposed and developed by the mask plate to respectively form a photoresist-removed area and a photoresist-remained area. Here, the photoresist-remained area corresponds to an area where the pattern of the gate lines and the gate electrodes resides on, and the photoresist-removed area corresponds to an area other than the pattern of the common electrodes. Then it is subjected to the developing process. The photoresist in the photoresist-removed area is totally removed, and the thickness of the photoresist in the photoresist-remained area remains unchanged. The film of the gate metal layer in the photoresist-removed area is totally removed by the etching process, and the remaining photoresist is removed, so that the pattern of the gate lines and the gate electrodes is formed.

Step 3, forming a gate insulation layer on the substrate after the completion of step 2.

In particular, the gate insulation layer with the thickness of 500-5000 Å may be deposited on the substrate by a process of Plasma Enhanced Chemical Vapor Deposition (PECVD) after the completion of step 2. The gate insulation layer may be made of oxide, nitride, or nitrogen oxide, which corresponds to the reactive gas of $SiH_4$, $NH_3$, $N_2$ or $SiH_2Cl_2$, $NH_3$, $N_2$.

Step 4, forming a pattern of a source layer and an etching stop layer (ESL) on the substrate after the completion of step 3.

In particular, a layer of semiconductor material and a layer of insulation material are sequentially deposited on the substrate, a layer of photoresist is coated on the insulation material, the photoresist is exposed by a half tone mask plate or a grey tone mask plate to respectively form a photoresist-removed area, a photoresist-half-remained area and a photoresist-totally-remained area. Here, the photoresist-totally-remained area corresponds to an area where the pattern of the etching stop layer resides on, and the photoresist-removed area corresponds to an area other than the pattern of the active layer. Then it is subjected to a developing process. The photoresist in the photoresist-removed area is totally removed, and the thickness of the photoresist in the photoresist-totally-remained area remains unchanged. A portion of the photoresist remains in the photoresist-half-remained area, and the semiconductor material in the photoresist-removed area are totally removed by the etching process to form the pattern of the active layer. The photoresist in the photoresist-half-remained area is ashed, and the insulation material in the photoresist-half-remained area is removed by the etching process to form the pattern of the etching stop layer and remove the remained photoresist.

Step 5, forming a pattern of data lines, source electrodes and drain electrodes on the substrate after the completion of step 4.

In particular, a source-drain metal layer with the thickness of about 2000-4000 Å may be formed on the substrate by a process of magnetron sputtering, or thermal evaporation, or another process for forming a film after the completion of step 4. The source-drain metal layer may be made of metal such as Cu, Al, Ag, Mo, Cr, Nd, Ni, Mn, Ti, Ta or W, or the alloy of two or more of these metals. The source-drain metal layer may be in a single layer structure or a multi-layer structure, and the multi-layer structure may be of, for example Cu\Mo, Ti\Cu\Ti, Mo\Al\Mo or etc. A layer of photoresist is coated on the source-drain metal layer, the photoresist is exposed by the mask plate to respectively form the photoresist-removed area and the photoresist-remained area Here, the photoresist-remained area corresponds to an area where the pattern of the source electrodes, the drain electrodes and the data lines resides on, and the photoresist-removed area corresponds to an area other than the pattern of the source electrodes, the drain electrodes and the data lines. Then it is subjected to a developing process, the photoresist in the photoresist-removed area is totally removed, and the thickness of the photoresist in the photoresist-remained area remains unchanged. Then the source-drain metal layer in the photoresist-removed area is totally removed by the etching process, and the remaining photoresist is removed, so that the drain electrodes, the source electrodes and the data lines are formed. In this embodiment, the data lines are the signal lines 4 shown in FIG. 6. The signal lines 4 include a portion that is not covered under the conductive connection lines 2 shown in FIG. 6, and further include a portion that is covered under the conductive connection lines 2. The pattern of the date lines that is covered under the conductive connection lines 2 coincides with the pattern of the conductive connection lines 2.

Step 6, forming a passivation layer including via holes for the pixel electrodes on the substrate after the completion of step 5.

In particular, the passivation layer with the thickness of about 2000-1000 Å may be formed on the substrate by a process of the magnetron sputtering, thermal evaporation, the PECVD, or another process for forming the film after the completion of step 5. Specifically the passivation layer may be made of oxide, nitride or nitrogen oxide. In particular, the passivation layer may be made of SiNx, SiOx or Si(ON)x, and the passivation layer also may be made of $Al_2O_3$. The passivation layer may be in a single layer structure, or in a double layer structure made of the silicon nitride and the silicon oxide. Here, the silicon oxide corresponds to the reactive gas of $SiH_4$, $N_2O$; the nitride or the nitrogen oxide corresponds to the reactive gas of $SiH_4$, $NH_3$, $N_2$ or $SiH_2Cl_2$, $NH_3$, $N_2$. A pattern including the passivation with the via holes is formed by a patterning process. In particular, an organic resin with a thickness of about 4000-30000 Å is coated on the passivation layer. The organic resin may be benzocyclobutene (BCB) or another organic photosensitive material. After exposing and developing, the pattern of the passivation layer with the via holes for the pixel electrodes is formed by an etching process.

Step 7, forming a pattern of the pixel electrodes and the conductive connection lines 2 on the substrate after the completion of step 6.

Figure 6:
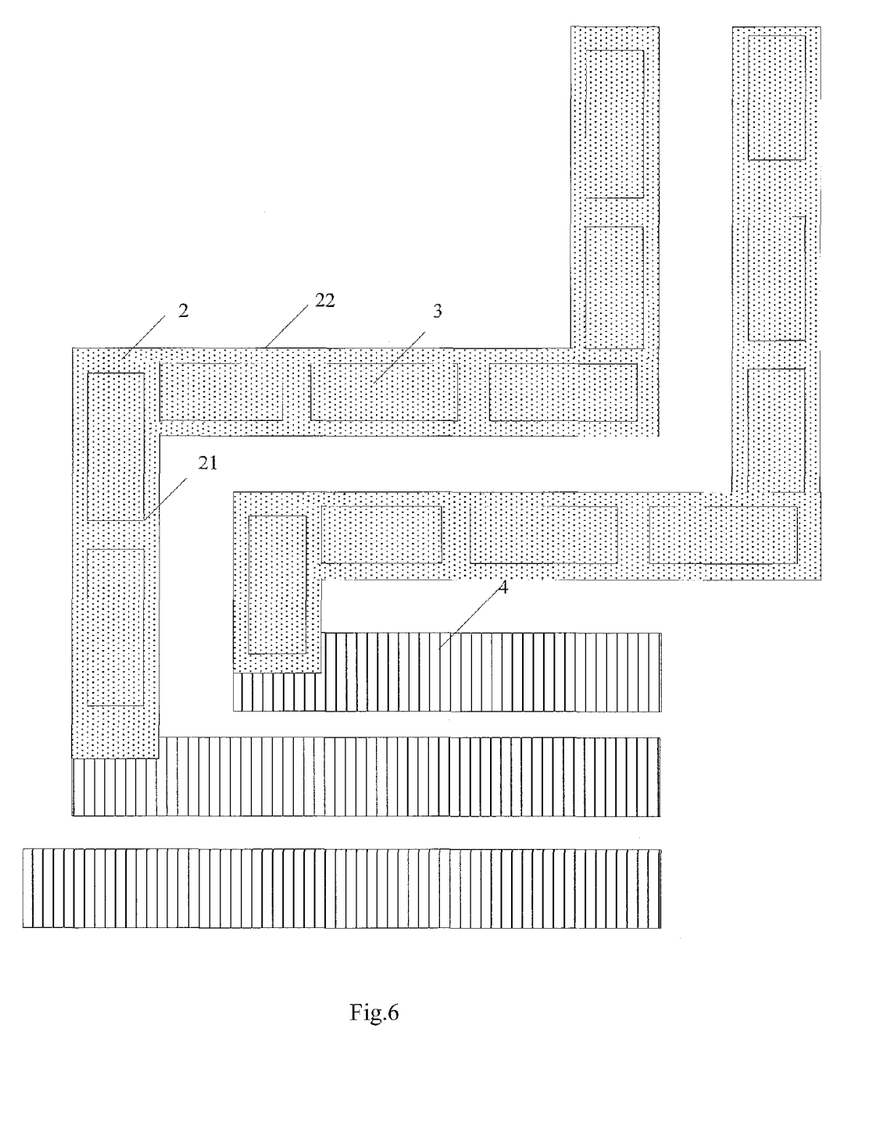
FIG. 6 illustrates a structure of the conductive connection lines in the pad area of the array substrate according to a first embodiment of the present disclosure.

In particular, a transparent conductive layer with a thickness of about 300-1500 Å is deposited on the substrate by a process of sputtering or thermal evaporation after the completion of step 6. The transparent conductive layer may be made of ITO, IZO or another kind of transparent metal oxide. The transparent conductive layer is coated with a layer of the photoresist, the photoresist is exposed by the mask plate to respectively form a photoresist-removed area and a photoresist-remained area. Here, the photoresist-remained area corresponds to an area of the pattern of the pixel electrodes and the conductive connection lines 2, and the photoresist-removed area corresponds to an area other than area of the pattern of the pixel electrodes and the conductive connection lines 2. It is subjected to be developed, wherein the photoresist in the photoresist-removed area is totally removed, and the thickness of the photoresist in the photoresist-remained area remains unchanged. Then the film of the transparent and conductive layer in the photoresist-removed area is totally removed by the etching process, and the remaining photoresist is removed, so that the pattern of the pixel electrodes and the conductive connection lines 2 is formed. The pattern of the conductive connection lines 2 is illustrated in FIG. 6. The conductive connection lines 2 are connected to the data lines 4 through the via holes 3, and the pixel electrodes are connected to the drain electrodes through the via holes for the pixel electrodes.

In this embodiment, the array substrate may be manufactured based on above steps 1-7. As illustrated in FIG. 6, in the array substrate, the conductive connection lines 2 include horizontal portions (the first wires 21) and longitudinal portions (the second wires 22). Thus, no matter whether the flexible circuit is displaced in the horizontal direction or in the longitudinal direction relative to the conductive connection lines 2, the contact area between the flexible circuit and the conductive connection lines are kept to be large enough, and the adverse effect caused by the displacement of the flexible circuit is reduced, so that the occurrence of the defect of non-uniformly displaying is effectively reduced.

Second Embodiment

In this embodiment, the method for manufacturing the array substrate specifically includes the following steps:

Step 1, providing a base substrate on which a pattern of common electrodes is formed.

Specifically, the base substrate may be a glass substrate or a quartz substrate. In particular, a transparent conductive layer with a thickness of about 300-1500 Å is deposited on the base substrate by a process of sputtering or thermal evaporation. The transparent conductive layer may be made of ITO, IZO or another kind of transparent metal oxide. The transparent conductive layer is coated with a layer of the photoresist, the photoresist is exposed by the mask plate to respectively form a photoresist-removed area and a photoresist-remained area. Here, the photoresist-remained area corresponds to an area of the pattern of the common electrode, and the photoresist-removed area corresponds to an area other than area of the pattern of the pixel electrodes and the conductive connection lines 2. It is subjected to be developed, wherein the photoresist in the photoresist-removed area is totally removed, and the thickness of the photoresist in the photoresist-remained area remains unchanged. Then the film of the transparent and conductive layer in the photoresist-totally-removed area is totally removed by an etching process, and the remaining photoresist is removed, so that the pattern of the common electrodes is formed.

Step 2, forming a pattern of gate electrodes and gate lines on the substrate after the completion of step 1.

In particular, a gate metal layer with a thickness of about 500-4000 Å is deposited on the base substrate by the process of sputtering or thermal evaporation after the completion of step 1. The gate metal layer may be made of the metal such as Cu, Al, Ag, Mo, Cr, Nd, Ni, Mn, Ti, Ta, W or a composition of those metals, the gate metal layer may be in a single layer structure or a multi-layer structure, and the multi-layer structure may be of, for example Cu\Mo, Ti\Cu\Ti, Mo\Al\Mo or etc. A layer of photoresist is coated on the gate metal layer. The photoresist is exposed and developed by the mask plate to respectively form a photoresist-removed area and a photoresist-remained area. Here, the photoresist-remained area corresponds to an area where the pattern of the gate lines and the gate electrodes resides on, and the photoresist-removed area corresponds to an area other than the area where the pattern of the gate lines and the gate electrodes resides on. Then it is subjected to the developing process. The photoresist in the photoresist-removed area is totally removed, and the thickness of the photoresist in the photoresist-remained area remains unchanged. Then the film of the gate metal layer in the photoresist-removed area is totally removed by the etching process, and the remaining photoresist is removed, so that the pattern of the gate lines and the gate electrodes is formed. In this embodiment, the gate lines are the signal lines 4 in FIG. 7. The signal lines 4 include a portion that is not covered under the conductive connection lines 2 shown in FIG. 6, and further include a portion that is covered under the conductive connection lines 2. The pattern of the gate lines that is covered under the conductive connection lines 2 coincides with the pattern of the conductive connection lines 2.

Step 3, forming a gate insulation layer on the substrate after the completion of step 2.

In particular, the gate insulation layer with the thickness of 500-5000 Å may be deposited on the substrate by a process of Plasma Enhanced Chemical Vapor Deposition (PECVD) after the completion of step 2. The gate insulation layer may be made of oxide, nitride, or nitrogen oxide, which corresponds to the reactive gas of $SiH_4$, $NH_3$, $N_2$ or $SiH_2Cl_2$, $NH_3$, $N_2$.

Step 4, forming a pattern of the source layer and the etching stop layer on the substrate after the completion of step 3.

In particular, a layer of the semiconductor material and a layer of the insulation material are sequentially deposited on the substrate, a layer of photoresist is coated on the insulation material, the photoresist is exposed by a half tone mask plate or a grey tone mask plate to respectively form a photoresist-removed area, a photoresist-half-remained area and a photoresist-totally-remained area. Here, the photoresist-totally-remained area corresponds to an area where the pattern of the etching stop layer resides on, and the photoresist-removed area corresponds to an area other than the pattern of the active layer. Then it is subjected to the developing process. The photoresist in the photoresist-removed area is totally removed, and the thickness of the photoresist in the photoresist-totally-remained area remains unchanged. A portion of the photoresist remains in the photoresist-half-remained area, and the semiconductor material in the photoresist-removed area are totally removed by the etching process to form the pattern of the active layer. The photoresist in the photoresist-half-remained area is ashed, and the insulation material in the photoresist-half-remained area is removed by the etching process to form the pattern of the etching stop layer and remove the remained photoresist.

Step 5, forming a pattern of data lines, source electrodes and drain electrodes on the substrate after the completion of step 4.

In particular, a source-drain metal layer with the thickness of about 2000-4000 Å may be formed on the substrate by a process of magnetron sputtering, or thermal evaporation, or another process for forming a film after the completion of step 4. The source-drain metal layer may be made of metal such as Cu, Al, Ag, Mo, Cr, Nd, Ni, Mn, Ti, Ta or W, or the alloy of two or more of these metals. The source-drain metal layer may be in a single layer structure or a multi-layer structure, and the multi-layer structure may be of, for example Cu\Mo, Ti\Cu\Ti, Mo\Al\Mo or etc. A layer of photoresist is coated on the source-drain metal layer, the photoresist is exposed by the mask plate to respectively form the photoresist-removed area and the photoresist-remained area. Here, the photoresist-remained area corresponds to an area where the pattern of the source electrodes, the drain electrodes and the data lines resides on, and the photoresist-removed area corresponds to an area other than the pattern of the source electrodes, the drain electrodes and the data lines. Then it is subjected to the developing process. The photoresist in the photoresist-removed area is totally removed, and the thickness of the photoresist in the photoresist-remained area remains unchanged. Then the source-drain metal layer in the photoresist-removed area is totally removed by the etching process, and the remaining photoresist is removed, so that the drain electrodes, the source electrodes and the data lines are formed.

Step 6, forming a passivation layer including the via holes for the pixel electrodes on the substrate after the completion of step 5.

In particular, the passivation layer with the thickness of about 2000-1000 Å may be formed on the substrate by a process of the magnetron sputtering, thermal evaporation, the PECVD, or another process for forming the film after the completion of step 5. The passivation layer may be made of oxide, nitride or nitrogen oxide. In particular, the passivation layer may be made of SiNx, SiOx or Si(ON)x, and the passivation layer also may be made of $Al_2O_3$. The passivation layer may be in a single layer structure, or in a double layer structure made of the silicon nitride and the silicon oxide. Here, the silicon oxide corresponds to the reactive gas of $SiH_4$, $N_2O$; the nitride or the nitrogen oxide corresponds to the reactive gas of $SiH_4$, $NH_3$, $N_2$ or $SiH_2Cl_2$, $NH_3$, $N_2$. A pattern including the passivation layer with the via holes is formed by a patterning process. In particular, an organic resin with a thickness of about 4000-30000 Å is coated on the passivation layer. The organic resin may be benzocyclobutene (BCB) or another organic photosensitive material. After exposing and developing, the pattern of the passivation layer with the via holes for the pixel electrodes is formed by an etching process.

Step 7, forming a pattern of the pixel electrodes and the conductive connection lines 2 on the substrate after the completion of step 6.

Figure 7:
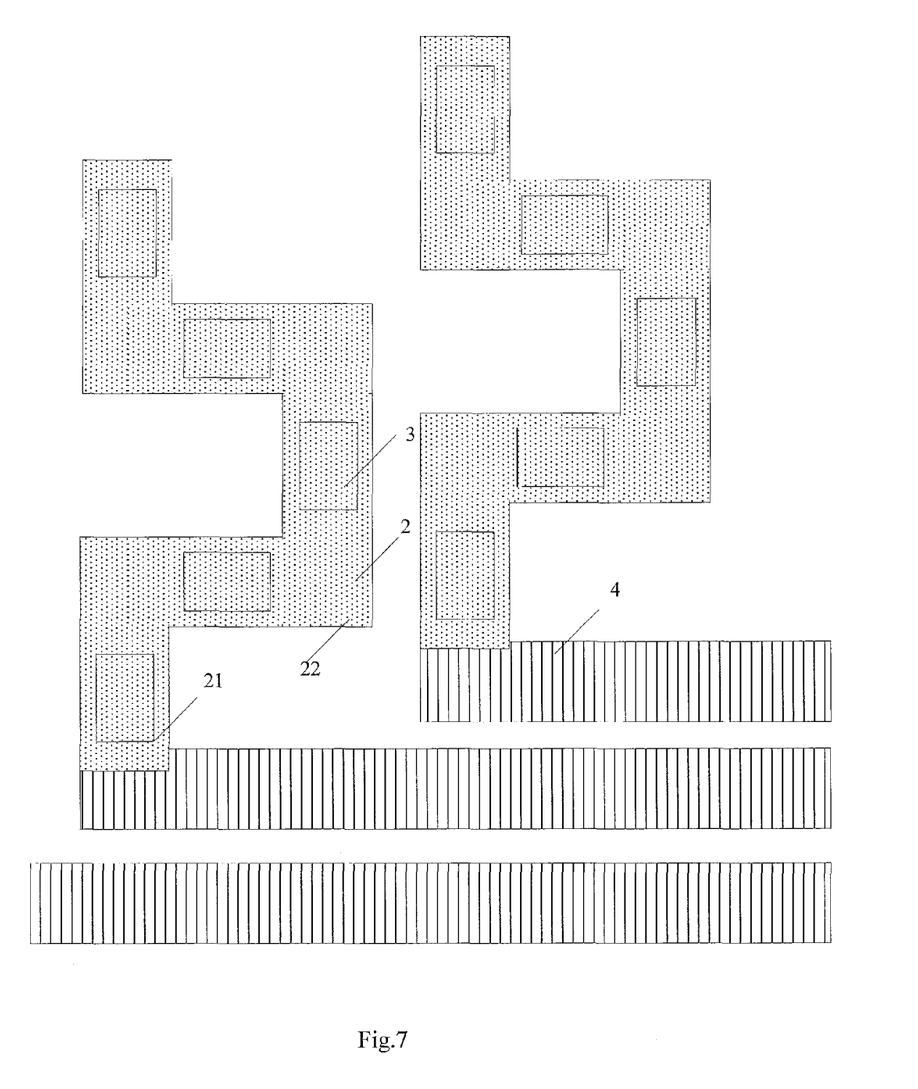
FIG. 7 illustrates a structure of the conductive connection lines in the pad area of the array substrate according to a second embodiment of the present disclosure.

In particular, a transparent conductive layer with a thickness of about 300-1500 Å is deposited on the substrate by a process of sputtering or thermal evaporation after the completion of step 6. The transparent conductive layer may be made of ITO, IZO or another kind of transparent metal oxide. The transparent conductive layer is coated with a layer of the photoresist, the photoresist is exposed by the mask plate to respectively form a photoresist-removed area and a photoresist-remained area. Here, the photoresist-remained area corresponds to an area where the pattern of the pixel electrodes, the drain electrodes and the data lines resides on, and the photoresist-removed area corresponds to an area other than the pattern of the source electrodes, the drain electrodes and the data lines. Then it is subjected to the developing process. The photoresist in the photoresist-removed area is totally removed, and the thickness of the photoresist in the photoresist-remained area remains unchanged. Then the film of the transparent and conductive layer in the photoresist-removed area is totally removed by the etching process, and the remaining photoresist is removed, so that the pattern of the pixel electrodes and the conductive connection lines 2 is formed. The pattern of the conductive connection lines 2 are illustrated in FIG. 7. The conductive connection lines 2 are connected to the gate lines 4 through the via holes 3, and the pixel electrodes are connected to the drain electrodes through the via holes for the pixel electrodes.

In this embodiment, the array substrate may be manufactured based on above steps 1-7. As illustrated in FIG. 7, in the array substrate, the conductive connection lines 2 include horizontal portions (the first wires 21) and longitudinal portions (the second wires 22). Thus, no matter whether the flexible circuit is displaced in the horizontal direction or in the longitudinal direction relative to the conductive connection lines 2, the contact area between the flexible circuit and the conductive connection lines are kept to be large enough, and the adverse effect caused by the displacement of the flexible circuit is reduced, so that the occurrence of the defect of non-uniformly displaying is effectively reduced.

The optional embodiments of the present disclosure have been discussed. It is appreciated that many modifications and polishes may be made to the present disclosure without departing from the principle of the present disclosure for those skilled in the art. These modifications and polishes should also be deemed to be fallen within the scope of the present disclosure.

What is claimed is:

1. An array substrate, comprising:
 a pad area;
 signal lines, arranged on the pad area; and
 conductive connection lines, arranged at least on the pad area and directly connected to a flexible circuit,
 wherein the conductive connection lines are connected to the signal lines through a via hole, and comprise a first wire and a second wire electrically connected to each other;
 wherein the second wire is arranged in such a manner that a contact area between the conductive connection lines and the flexible circuit is not less than a predetermined threshold when the flexible circuit is displaced in a first direction relative to the first wire; and
 wherein the first direction is substantially perpendicular to an extending direction of the first wire.

2. The array substrate according to claim 1, wherein in the pad area, a pattern of the signal lines in a direction substantially perpendicular to the array substrate coincides with a pattern of the conductive connection lines.

3. The array substrate according to claim 1, wherein the extending direction of the first wire is substantially parallel to the flexible circuit.

4. The array substrate according to claim 1, wherein an extending direction of the second wire is substantially perpendicular to the extending direction of the first wire.

5. The array substrate according to claim 1, wherein the conductive connection lines are made of Indium Tin Oxide (ITO) or Indium Zinc Oxide (IZO).

6. The array substrate according to claim 1, wherein the signal lines are gate lines, data lines or common electrode lines.

7. The array substrate according to claim 6, further comprising:
an insulation layer, arranged to enable the gate lines, the data lines or the common electrode lines to be insulated from each other.

8. The array substrate according to claim 7, wherein the insulation layer comprises a gate insulation layer and a passivation layer.

9. The array substrate according to claim 4, wherein the conductive connection lines are in a shape of "+", "┬" or "⊥".

10. A display device, comprising:
an array substrate; and
a flexible circuit connected to the array substrate via conductive connection lines,
the array substrate comprises:
a pad area;
signal lines arranged on the pad area; and
the conductive connection lines arranged at least on the pad area and directly connected to the flexible circuit,
wherein the conductive connection lines are connected to signal lines through a via hole, and comprise a first wire and a second wire electrically connected to each other;
wherein the second wire is arranged in such a manner that a contact area between the conductive connection lines and the flexible circuit is not less than a predetermined threshold when the flexible circuit is displaced in a first direction relative to the first wire; and
wherein the first direction is substantially perpendicular to an extending direction of the first wire.

11. The display device according to claim 10, wherein in the pad area, a pattern of the signal lines in a direction substantially perpendicular to the array substrate coincides with a pattern of the conductive connection lines.

12. The display device according to claim 10, wherein the extending direction of the first wire is substantially parallel to the flexible circuit.

13. The display device according to claim 10, wherein an extending direction of the second wire is substantially perpendicular to the extending direction of the first wire.

14. The display device according to claim 10, wherein the conductive connection lines are made of Indium Tin Oxide (ITO) or Indium Zinc Oxide (IZO).

15. The display device according to claim 10, wherein the signal lines are gate lines, data lines or common electrode lines.

16. The display device according to claim 15, further comprising:
an insulation layer arranged to enable the gate lines, the data lines or the common electrode lines to be insulated from each other.

17. The display device according to claim 16, wherein the insulation layer comprises a gate insulation layer and a passivation layer.

18. The display device according to claim 13, wherein the conductive connection lines are in a shape of "+", "┬" or "⊥".

19. A method for manufacturing an array substrate comprising a pad area, the method comprising:
depositing a metal film, and forming a pattern of signal lines by a patterning process; and
depositing a conductive film, and forming a pattern of conductive connection lines at least on the pad area by another patterning process, so that the conductive connection lines are connected to the signal lines through a via hole, and comprise a first wire and a second wire electrically connected to each other;
wherein the second wire is arranged in such a manner that a contact area between the conductive connection lines and the flexible circuit is not less than a predetermined threshold when the flexible circuit is displaced in a first direction relative to the first wire; and
wherein the first direction is substantially perpendicular to an extending direction of the first wire.

20. The method according to claim 19, wherein in the pad area, a pattern of the signal lines in a direction substantially perpendicular to the array substrate coincides with a pattern of the conductive connection lines.

* * * * *